United States Patent
Hori et al.

(10) Patent No.: US 9,278,503 B2
(45) Date of Patent: Mar. 8, 2016

(54) FRICTION STIR WELDING STRUCTURE AND POWER SEMICONDUCTOR DEVICE

(75) Inventors: Toshio Hori, Hitachinaka (JP); Keiichi Uraki, Hitachinaka (JP); Masato Higuma, Hitachinaka (JP); Yujiro Kaneko, Hitachinaka (JP); Satoshi Hirano, Tokyo (JP); Akihiro Sato, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/235,644

(22) PCT Filed: Aug. 9, 2012

(86) PCT No.: PCT/JP2012/070360
§ 371 (c)(1),
(2), (4) Date: Jan. 28, 2014

(87) PCT Pub. No.: WO2013/027600
PCT Pub. Date: Feb. 28, 2013

(65) Prior Publication Data
US 2014/0210070 A1    Jul. 31, 2014

(30) Foreign Application Priority Data
Aug. 19, 2011    (JP) ................... 2011-179706

(51) Int. Cl.
| | |
|---|---|
| *B23K 20/12* | (2006.01) |
| *B32B 15/01* | (2006.01) |
| *H01L 23/10* | (2006.01) |
| *H01L 23/34* | (2006.01) |
| *H01L 23/473* | (2006.01) |

(52) U.S. Cl.
CPC ............. *B32B 15/01* (2013.01); *B23K 20/122* (2013.01); *B23K 20/129* (2013.01); *H01L 23/10* (2013.01); *H01L 23/34* (2013.01); *B23K 2201/40* (2013.01); *B23K 2203/10* (2013.01); *H01L 23/473* (2013.01); *H01L 2924/0002* (2013.01); *Y10T 428/12493* (2015.01)

(58) Field of Classification Search
None
See application file for complete search history.

(56) References Cited

U.S. PATENT DOCUMENTS

| | | | |
|---|---|---|---|
| 6,290,117 B1* | 9/2001 | Kawasaki et al. | 228/112.1 |
| 6,557,746 B2* | 5/2003 | Ezumi et al. | 228/112.1 |
| 7,661,575 B2 | 2/2010 | Aota et al. | |
| 2001/0007717 A1* | 7/2001 | Ezumi et al. | 428/609 |
| 2001/0010855 A1* | 8/2001 | Aota et al. | 428/98 |
| 2002/0153130 A1* | 10/2002 | Okamoto et al. | 165/170 |
| 2003/0005852 A1* | 1/2003 | Okamura et al. | 105/396 |

(Continued)

FOREIGN PATENT DOCUMENTS

| | | |
|---|---|---|
| JP | 11-58039 A | 3/1999 |
| JP | 2001-355436 A | 12/2001 |

(Continued)

OTHER PUBLICATIONS

International Search Report (PCT/ISA/210) with English translation dated Nov. 6, 2012 (Six (6) pages).

*Primary Examiner* — Kiley Stoner
(74) *Attorney, Agent, or Firm* — Crowell & Moring LLP

(57) ABSTRACT

A friction stir welding structure is comprised of a first and a second member integrated into one piece by friction stir welding, and in which a thin section is formed along the friction stir weld section on at least one of either of the first and the second member.

4 Claims, 20 Drawing Sheets

(56) References Cited

U.S. PATENT DOCUMENTS

| | | |
|---|---|---|
| 2003/0230625 A1* | 12/2003 | Aota et al. ............. 228/112.1 |
| 2004/0134971 A1* | 7/2004 | Narita et al. ............ 228/112.1 |
| 2005/0247756 A1* | 11/2005 | Frazer et al. ............... 228/101 |
| 2006/0138197 A1* | 6/2006 | Aota et al. ............. 228/112.1 |
| 2006/0213465 A1 | 9/2006 | Sunada et al. ............ 123/41.84 |
| 2008/0096038 A1* | 4/2008 | Nagano ..................... 428/586 |
| 2009/0120995 A1* | 5/2009 | Hallinan et al. ............. 228/2.3 |
| 2010/0001133 A1* | 1/2010 | Kempa et al. ............ 244/118.6 |
| 2011/0308059 A1* | 12/2011 | Seo et al. ..................... 29/428 |
| 2011/0310585 A1 | 12/2011 | Suwa et al. |
| 2012/0227890 A1* | 9/2012 | Yamauchi et al. .......... 156/73.5 |
| 2013/0265724 A1 | 10/2013 | Kaneko et al. |
| 2013/0279230 A1 | 10/2013 | Suwa et al. |
| 2013/0328185 A1 | 12/2013 | Hiramitsu et al. |

FOREIGN PATENT DOCUMENTS

| | | | | |
|---|---|---|---|---|
| JP | 2003-266181 A | 9/2003 | | |
| JP | 2004-022914 A | 1/2004 | | |
| JP | 2005324251 A * | 11/2005 | ............ | B23K 20/12 |
| JP | 2006187809 A * | 7/2006 | | |
| JP | 2009079267 A * | 4/2009 | | |
| JP | 2009-154209 A | 7/2009 | | |
| JP | 2010-140951 A | 6/2010 | | |
| JP | 2012-005322 A | 1/2012 | | |
| JP | 2012-015224 A | 1/2012 | | |
| JP | 2012-138409 A | 7/2012 | | |
| JP | 2012-178484 A | 9/2012 | | |
| JP | 2012-257369 A | 12/2012 | | |
| JP | 2013-211942 A | 10/2013 | | |
| KR | 20020051857 A * | 6/2002 | | |

* cited by examiner

SECOND EMBODIMENT

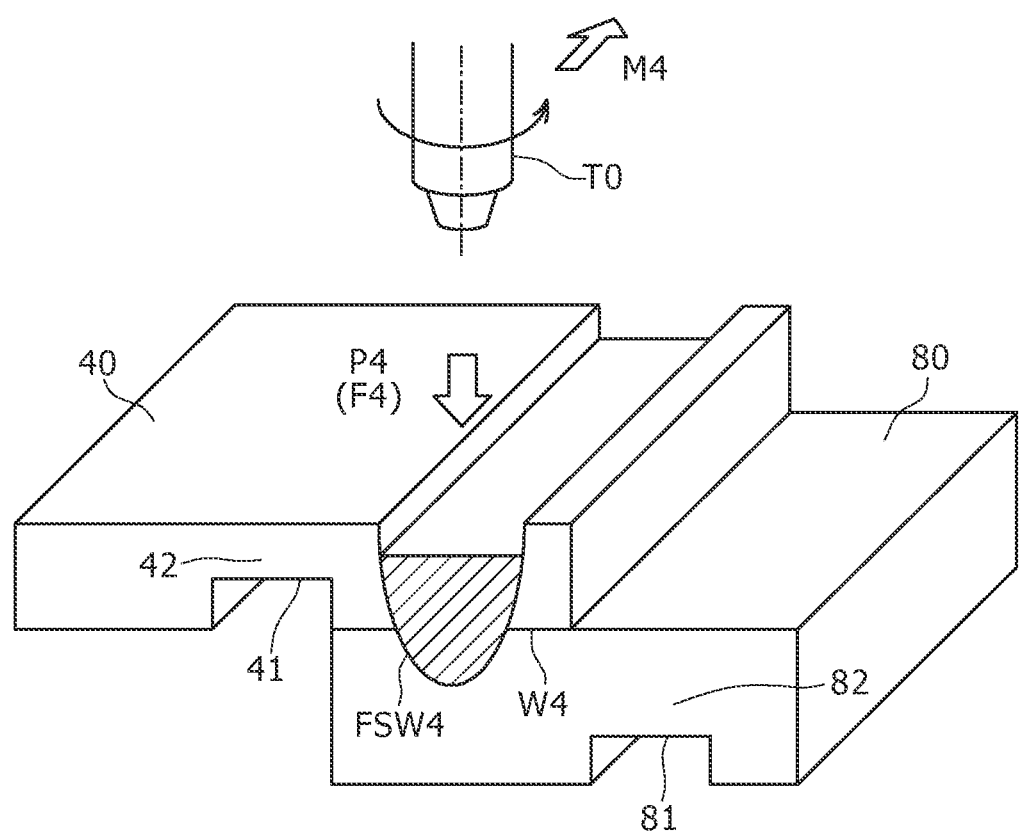

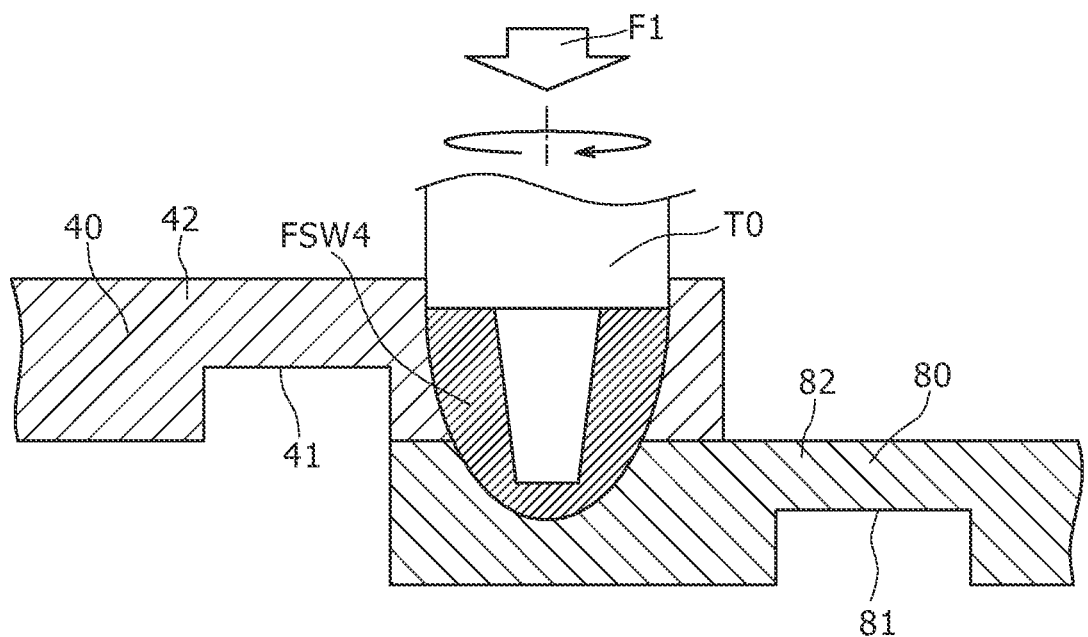

SIXTH EMBODIMENT

SEVENTH EMBODIMENT

FIG.10

| W(mm) | 0 (NO THIN SECTION) | 4.7 |
|---|---|---|
| FLATNESS (mm) | 0.08 | 0.04 |

FRICTION STIR WELDING STRUCTURE AND POWER SEMICONDUCTOR DEVICE

TECHNICAL FIELD

The present invention relates to welding structure utilizing friction stir welding, and a power semiconductor device utilizing the friction stir welding structure.

BACKGROUND ART

A method for welding metal members together is known as friction stir welding (FSW). Friction stir welding is a method utilizing friction heat to join members together by heating and softening and also inducing a plasticizing flow by the rotation of a rotation tool (hereafter called FSW tool) by insertion while pressing the rotation tool up against the boundary surface of the metal members to be joined together.

A manufacturing method for a water-cooling jacket comprised of a jacket piece including a cavity with an opening in one section and a sealer to seal the opening of the cavity is disclosed in patent literature 1. In this manufacturing method a butt joint is formed by a side surface on a step formed in the opening of the jacket piece and the side surface of the sealant, and welding the abutting surfaces of the butt joint by friction welding stirring.

CITATION LIST

Patent Literature

Patent Literature 1: Japanese Unexamined Patent Application Publication No. 2010-140951

SUMMARY OF INVENTION

Technical Problem

Friction heat and a pressing load from the FSW tool occur in the welding members during the friction stir welding due to the pressing and inserting the FSW tool against the metallic members (welding members) to be joined. Deformation from friction heat and the load therefore occurs in the welding members due to the friction stir welding.

Solution to Problem

According to a first aspect of the present invention, the friction stir welding structure comprises a first and a second member integrated into one piece by friction stir welding, and in which a thin section is formed along the friction stir weld section on at least one or either of the first and the second member.

According to a second aspect of the present invention, in the friction stir welding structure of the first aspect, the first member and the second member are preferably abutted together as a lap joint, and the abutted surface is friction stir welded.

According to a third aspect of the present invention, in the friction stir welding structure of the second aspect, the tensile strength S1 of the first member is set smaller than the tensile strength S2 of the second member, and the thickness L1 of the thin section of the first member is preferably set so that the weld depth D1 of the friction stir weld section is defined by the relation:

$$(2 \times S1)/(S1+S2) \times L1 < D1.$$

According to a fourth aspect of the present invention, in the friction stir welding structure of the third aspect, the first member is a rectangular plate, the second member includes an opening sealed by the rectangular plate, a step is formed in the opening of the second member; a weld section mounted on the step is formed on the outer peripheral edge of the first member, the section where the outer peripheral edge of the first member abuts the step inner surface of the opening of the second member is welded across the entire circumference by friction stir welding, and the thin section is preferably formed along the friction stir weld section of the first member.

According to a fifth aspect of the present invention, a power semiconductor device containing the friction stir welding structure of the fourth aspect, includes a power semiconductor module, a case to store the power semiconductor module, and a heat sink to cool the power semiconductor module; and in which the second member is the case, and the first member is the heat sink that seals the opening of the second member.

According to a sixth aspect of the present invention, in the friction stir welding structure of the first aspect, both the first and the second member contain a thin section.

According to a seventh aspect of the present invention, in the friction stir welding structure of the sixth aspect, the first member and second member are preferably abutted and friction stir welded together as a butt joint.

According to an eighth aspect of the present invention, in the friction stir welding structure of the seventh aspect, the tensile strength S1 of the first member is set smaller than the tensile strength S2 of the second member, and when a thickness of the thin section of the first member is L1, and the thickness of the thin section of the second member is L2, and the weld depth of the friction stir welding section is D1, preferably satisfies the relation:

$$(2 \times S1)/(S1+S2) \times L1 < D1$$

and $$(S1/S2) \times L1 < L2.$$

Advantageous Effects of Invention

According to the friction stir welding structure of the present invention, a thin section is formed on at least one of the welding members so that the heat generated during friction stir welding does not easily conduct to the center section of the material for joining and heat deformation in the main section of the material for joining can be prevented. Also, the thin section deforms from the push-pressure load acting on the welding members due to friction stir welding so that deformation of the main section of the welding members is prevented.

BRIEF DESCRIPTION OF DRAWINGS

FIG. 4B is an overall perspective view for describing the friction stir welding task of the fourth embodiment;

FIG. 4C is an enlarged cross sectional view showing the friction stir weld section of the fourth embodiment;

FIG. 10 is a table for describing the flatness level due to the presence or absence of the thin section.

DESCRIPTION OF EMBODIMENTS

First Embodiment

Figure 1A:
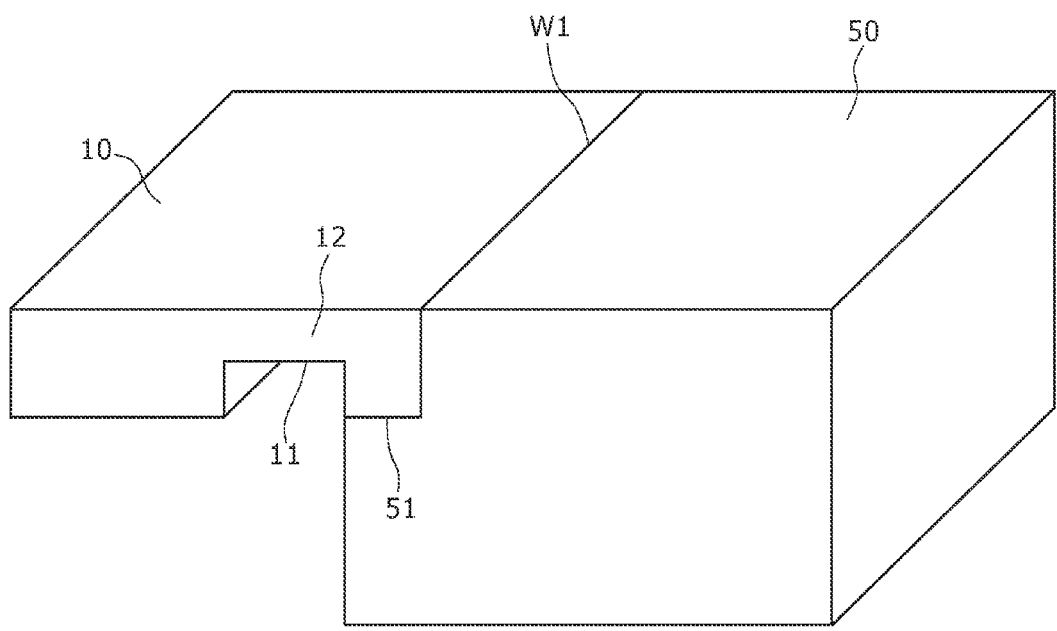
FIG. 1A is an overall perspective view showing the abutted state of a pair of welding members in the first embodiment.
Figure 1B:
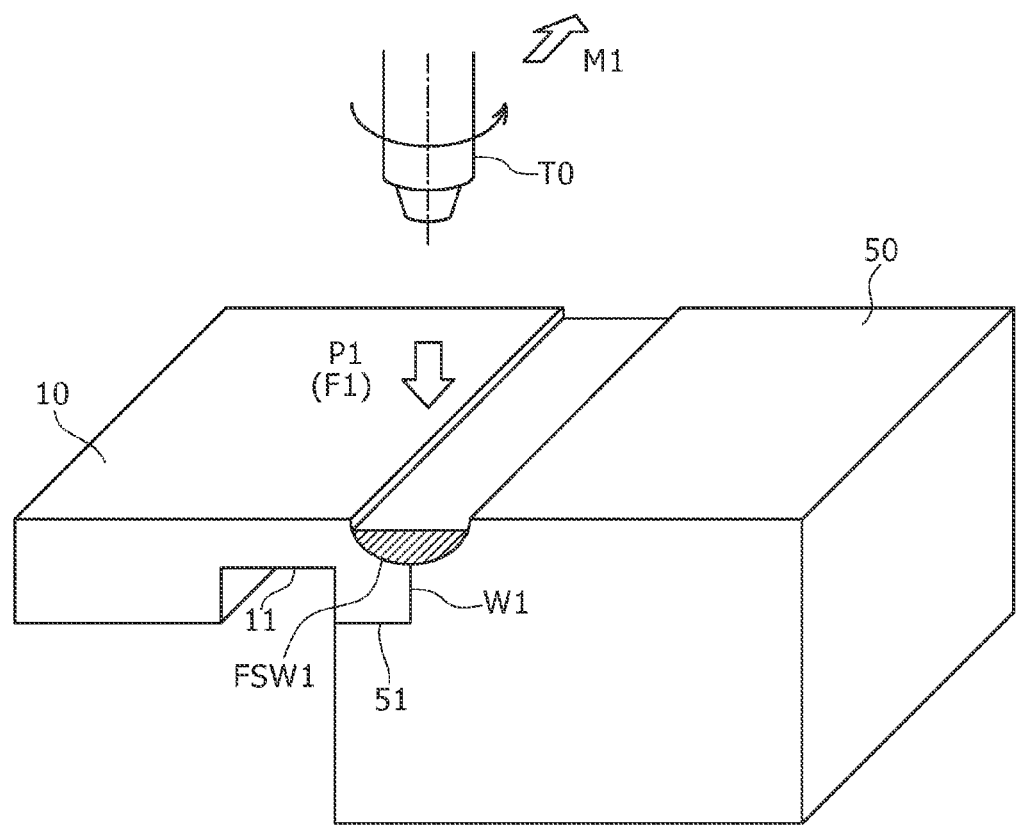
FIG. 1B is an overall perspective view for describing the friction stir welding task of the first embodiment.
Figure 1C:
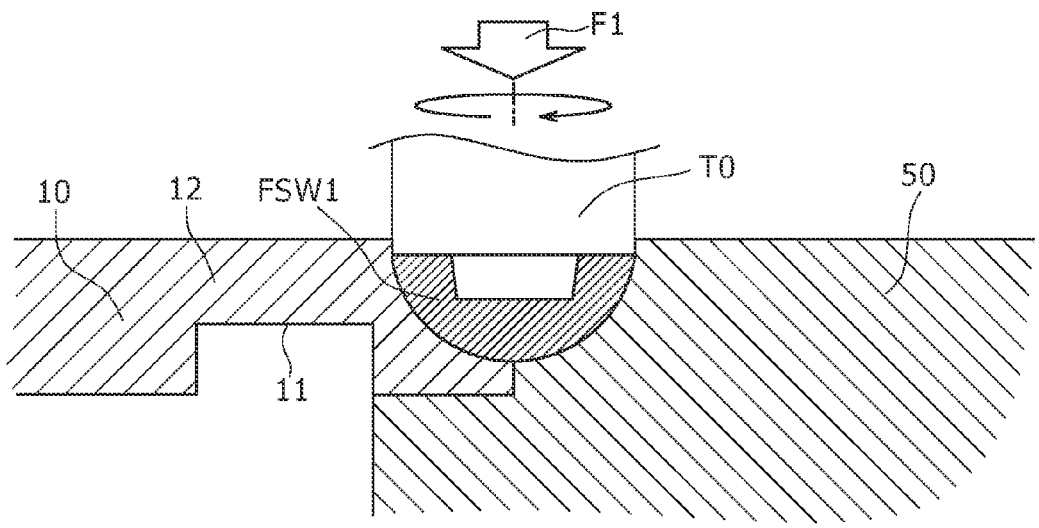
FIG. 1C is an enlarged cross sectional view showing the friction stir welding section of the first embodiment.

FIG. 1A through 1C are drawings for describing the friction stir welding structure of the first embodiment.

In this embodiment an integrated piece is formed by friction stir welding of the abutted surface W1 on the edge of the welding member 10 and the edge of the welding member 50 shown in FIG. 1A. Namely, the welding member 10 and the welding member 50 are abutted as a butt joint and their abutted surfaces are friction stir welded. FIG. 1B is a drawing showing the friction stir weld section FSW1 formed on the abutted surface W1. FIG. 1C is an enlarged cross sectional view showing the friction stir weld section FSW1.

The welding member 10 is a flat plate and a cavity 11 is formed on the rear side. A thin section 12 is formed on the welding member 10 by way of this cavity 11. The welding member 50 is a plate thicker than the welding member 10, and a step 51 is formed on the weld section with the welding member 10.

The edge of the welding member 10 is mounted on the step 51 formed on the edge of the welding member 50, and as shown in FIG. 1B, a rotating FSW tool TO is pressed by the load F1 in the P1 direction and inserts in the abutting surface W1 from the upper surface (top side in FIG. 1) of the abutting surface W1. Moreover, the FSW tool TO friction stir welds the welding member 10 and the welding member 50 while moving in the M1 direction to obtain a friction stir weld section FSW1 shown in detail in FIG. 1C.

The thin section 12 is positioned in the vicinity of the friction stir weld section FSW1 and so can render the following effects. The friction heat generated during the friction stir welding is conducted to the welding member 10 side. The heat conduction surface area of the thin section 12 mounted on the welding member 10 is reduced further than the heat conduction surface area on the end of the welding member 10 serving as the friction stir weld section FSW1, and has large heat resistance. The conduction of heat to the welding member 10 from the thin section 12 onward is therefore suppressed. Consequently, the heat deformation of the welding member 10 can be reduced.

The load F1 from the FSW tool TO is simultaneously applied to the welding member 10 during welding, however the deformation of the welding member 10 can be reduced at other than the thin section due to the deformation occurring preferentially (earlier) in the thin section 12 that is thinner and lower strength than the circumference.

In other words, mounting the thin section 12 along the friction stir weld section FSW1 prevents friction heat during friction stir welding and the load from the FSW tool TO from being conveyed to the entire of the welding member 10, and reduces the amount of deformation occurring in the welding member 10.

There are no restrictions on the shape of the welding member 10 in the friction stir welding structure of the first embodiment. In the welding structure shown in FIG. 1A through 1C, the abutting surface W1 is formed on one side but may be formed on even two or three sides. If the friction stir weld section is formed on two sides, then the thin section 12 is formed along two sides, and if the friction stir weld section is formed on three sides, then the thin section 12 is formed along three sides. The friction stir welding may be performed along the entire periphery of the welding member 10. In this case, the cavity 11 or namely the thin section 12 is also formed across the entire circumference on the inner side of the entire periphery.

The above description also jointly applies to the second embodiment through the fourth embodiment.

Figure 1D:
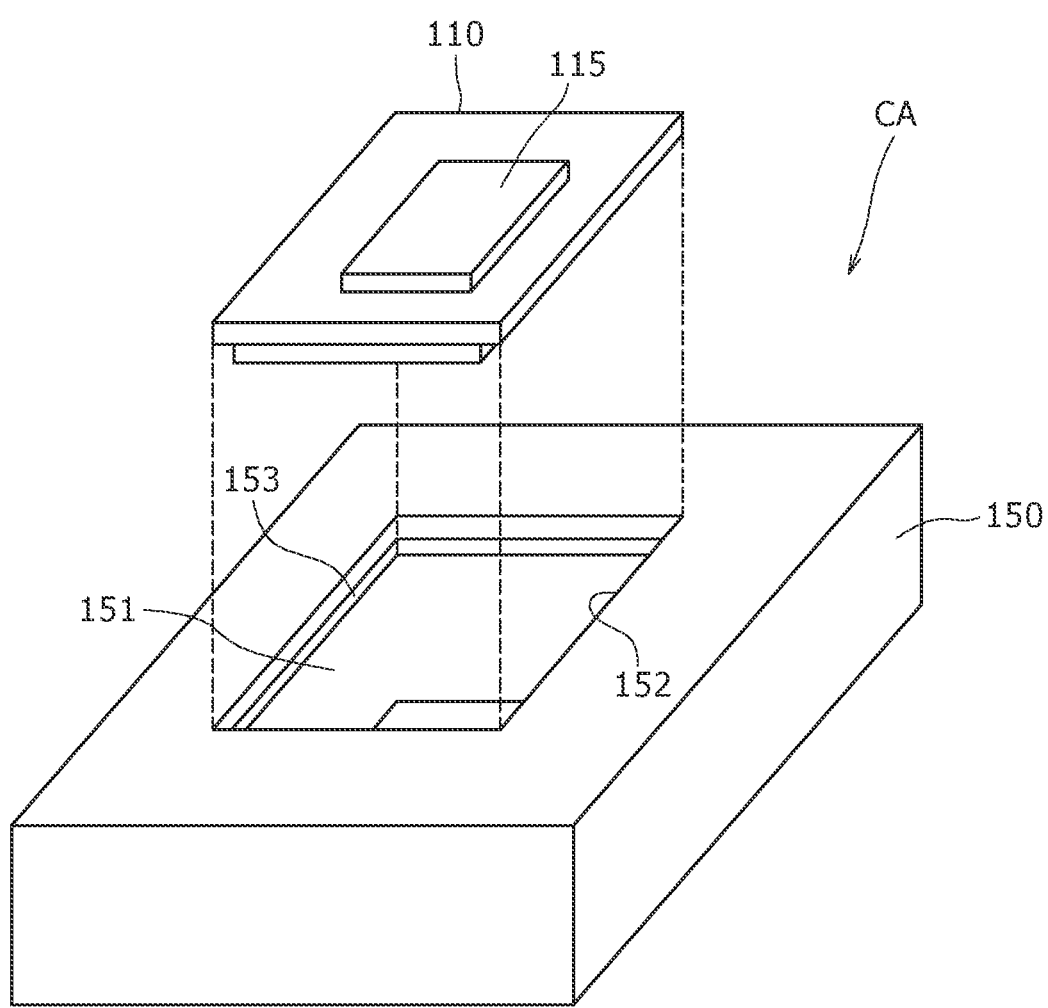
FIG. 1D is an exploded perspective view showing an application example of the first embodiment.
Figure 1E:
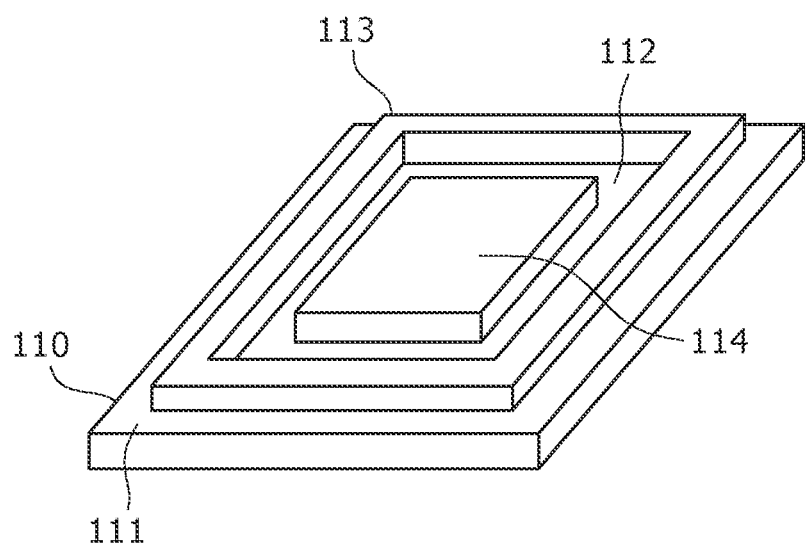
FIG. 1E is a perspective view of the lid of the application example of FIG. 1D as seen from the rear side.

FIG. 1D and FIG. 1E show application examples of the friction stir weld structure of the first embodiment to a cooling device for heat emitting electronic components.

The cooling device as shown FIG. 1D includes a container 150 serving as the cooling jacket where the cavity 151 is formed to allow coolant to flow, and a lid 110 to seal the opening 152 of the cavity 151. A step 153 is formed in the opening 152. A cooling inlet and outlet not shown in the drawing are formed on the container 150.

A heat emitting electronic component 115 serving as the member for cooling is mounted on the top surface of the lid 110. A step 111 formed on the periphery, and a cavity 112 enclosed a thick section 113 forming a step 111 along with a thick section 114 in the lid center is formed on the rear side of the lid 110. The thin section formed in the cavity 112 is equivalent to the thin section 12 of FIG. 1.

In this cooling device CA, the coolant flows through the cavity 151 and cools the heat emitting electronic component 115 mounted on the top surface of the lid 110. The heat emitting electronic component 115 must therefore be mounted closely attached to the top surface of the lid 110. The lid 110 is low strength compare to the container 150 and so is easily deformed by heat and the load F1 during friction stir welding, so deformation of the lid 110 mounting surface due to friction stir welding must be prevented.

Whereupon in the application example shown in FIGS. 1D and 1E, a thin section is formed by forming a cavity 112 on the inner periphery side of the lid 110. The plate thickness of this thin section is thin compared to the thick sections 113 and 114. The heat conducting cross sectional surface area is consequently small compared to the thick section 114 so that the entry of heat generated by friction stir welding to the mounting surface can be prevented, and deformation of the lid top surface and center thick section 114 can be prevented. The thin section 112 also deforms due to the load F1 during friction stir welding so the effect of suppressing deformation of the center thick section 114 of the lid 110 is also obtained.

Second Embodiment

Figure 2A:
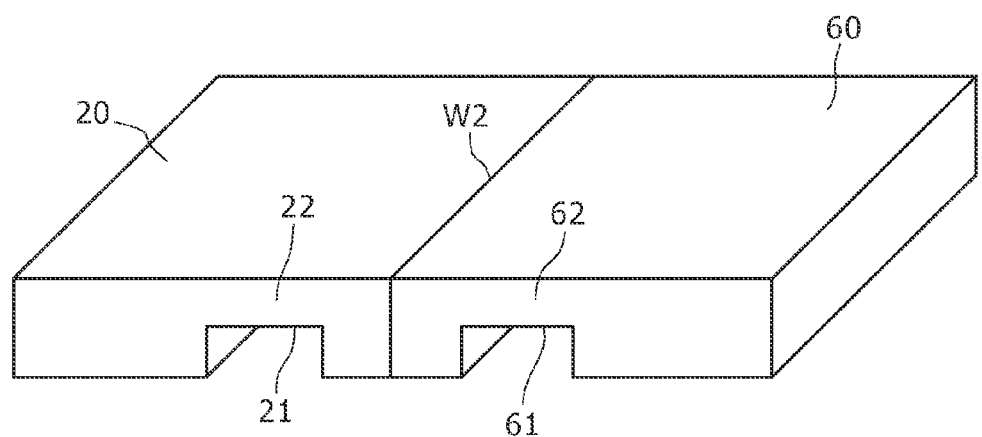
FIG. 2A is an overall perspective view showing the abutted state of a pair of welding members welded in the second embodiment.
Figure 2B:
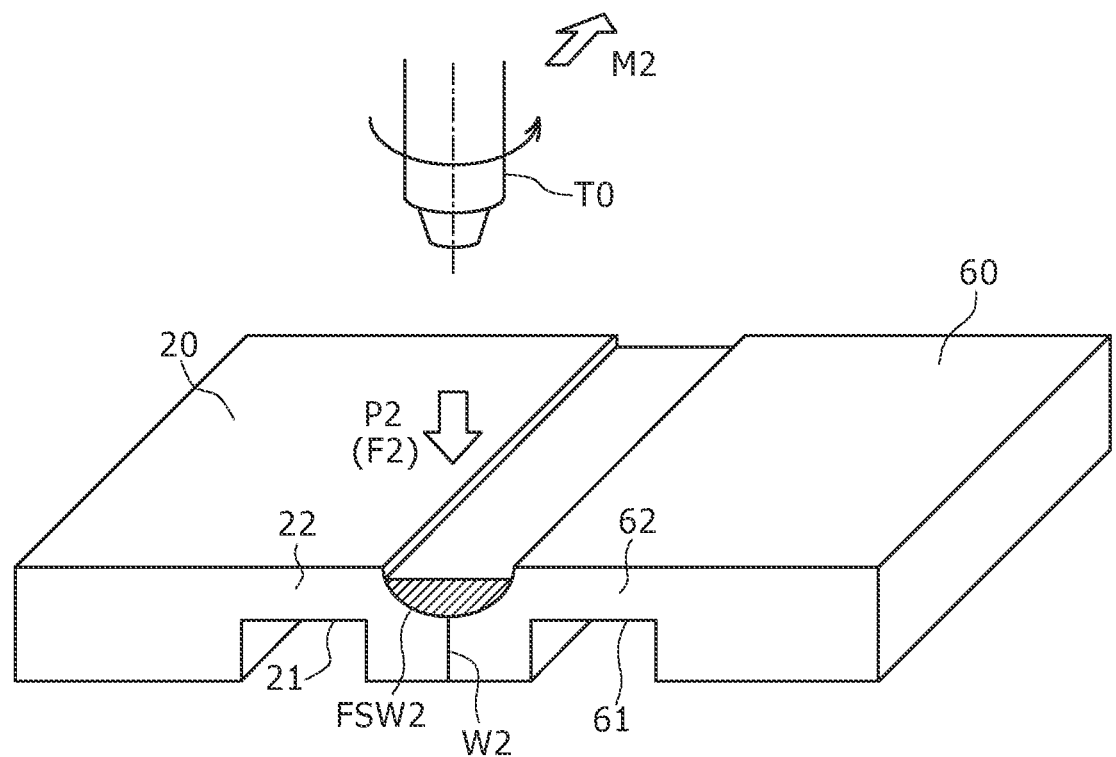
FIG. 2B is an overall perspective view for describing the friction stir welding task of the second embodiment.
Figure 2C:
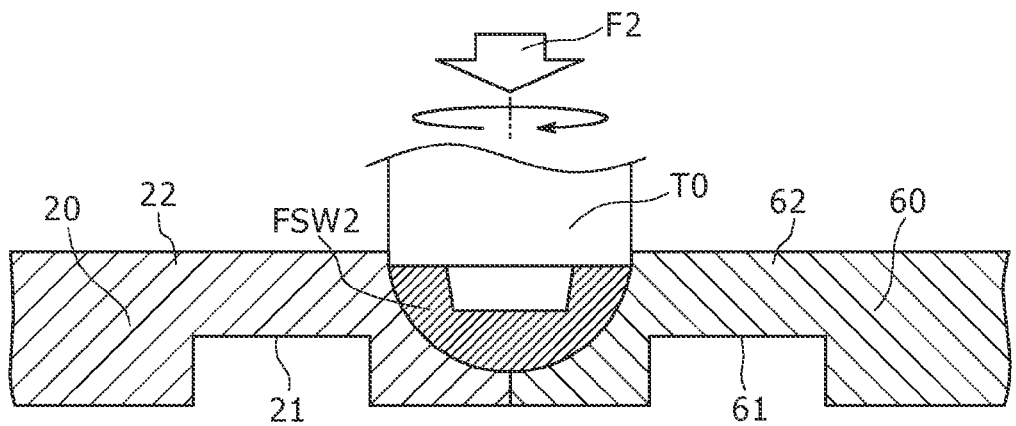
FIG. 2C is an enlarged cross sectional view showing the friction stir weld section of the second embodiment.

FIG. 2A through 2C are drawings for describing the friction stir welding structure of the second embodiment.

In the present embodiment, an integrated piece is formed by friction stir welding of the abutting surface W2 on the edge of the welding member 20 and the edge of the welding member 60 shown in FIG. 2A. In other words, the welding member 20 and the welding member 50 are abutted as a butt joint by friction stir welding. FIG. 2B is a drawing showing the friction stir weld section FSW2 formed on the abutted surface W2. FIG. 2C is an enlarged cross sectional view showing the friction stir weld section FSW2.

The welding member 20 is a flat plate and a cavity 21 is formed on the rear side. This cavity 21A forms a thin section 22 on the welding member 20. The welding member 60 is a flat plate, and the cavity 61 is formed on the rear side. This cavity 61 forms a thin section 62 on the welding member 60.

The edge of the welding member 20 is abutted the edge of the welding member 60, and as shown in FIG. 2B, the rotating FSW tool TO is pressed by the load F2 in the P2 direction and inserts in the abutting surface W2 from the upper side (top side in FIG. 2) of the abutting surface W2. Moreover, the FSW tool TO friction stir welds the welding member 20 and the welding member 60 while moving in the M2 direction to obtain a friction stir weld section FSW2 shown in detail in FIG. 2C.

The friction heat generated during this friction stir welding is conveyed to welding members 20 and 60 sides. The heat conducting surfaces of the thin sections 22, 62 formed on the welding members 20 and 60 are smaller than the heat conducting surface areas of the ends of the welding members 20 and 60 serving as the friction stir weld section FSW2 and the heat resistance is large. The conduction of heat is therefore suppressed to the welding member 20 side and welding member 60 side from the thin sections 22, 62 onward. The heat deformation of the welding members 20 and 60 can consequently be reduced.

The FSW tool TO at the same time applies a load F2 to the welding members 20 and 60 during welding. However, the thin sections 22, 62 are thinner and weaker (lower strength) than the periphery and so deform preferentially (earlier) and in this way reduce the deformation of the welding members 20 and 60 on other than the thin sections 22, 62.

Third Embodiment

Figure 3A:
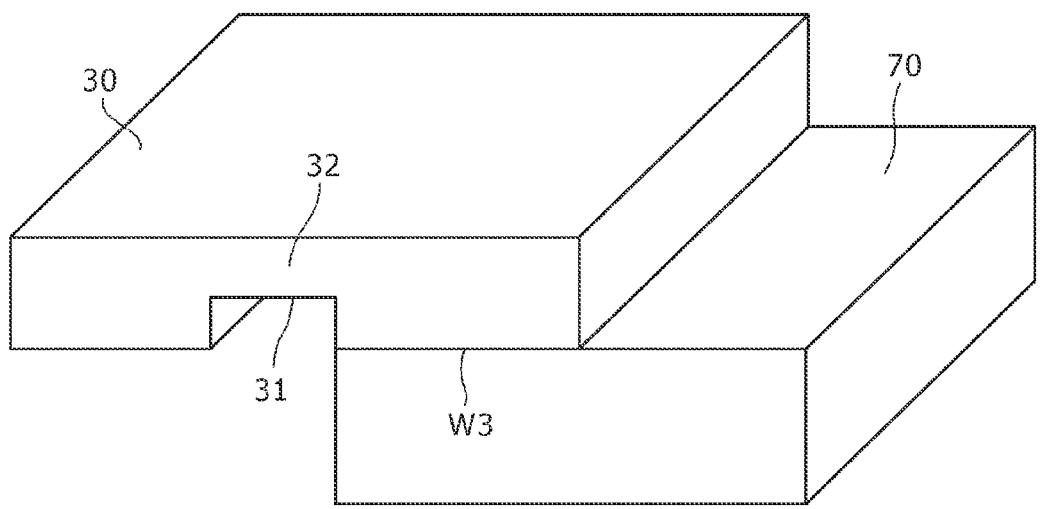
FIG. 3A is an overall perspective view showing the abutted state of a pair of welding members welded in the third embodiment.
Figure 3B:
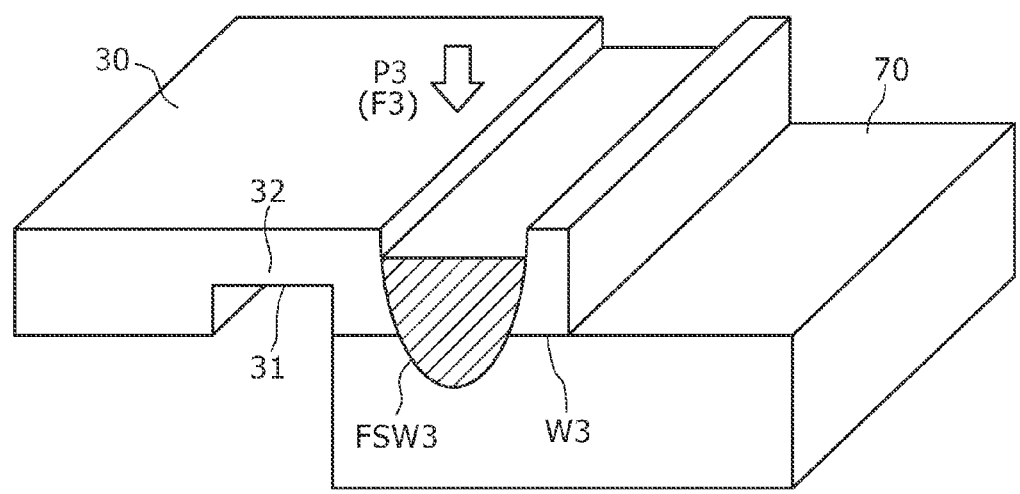
FIG. 3B is an overall perspective view for describing the friction stir welding task of the third embodiment.
Figure 3C:
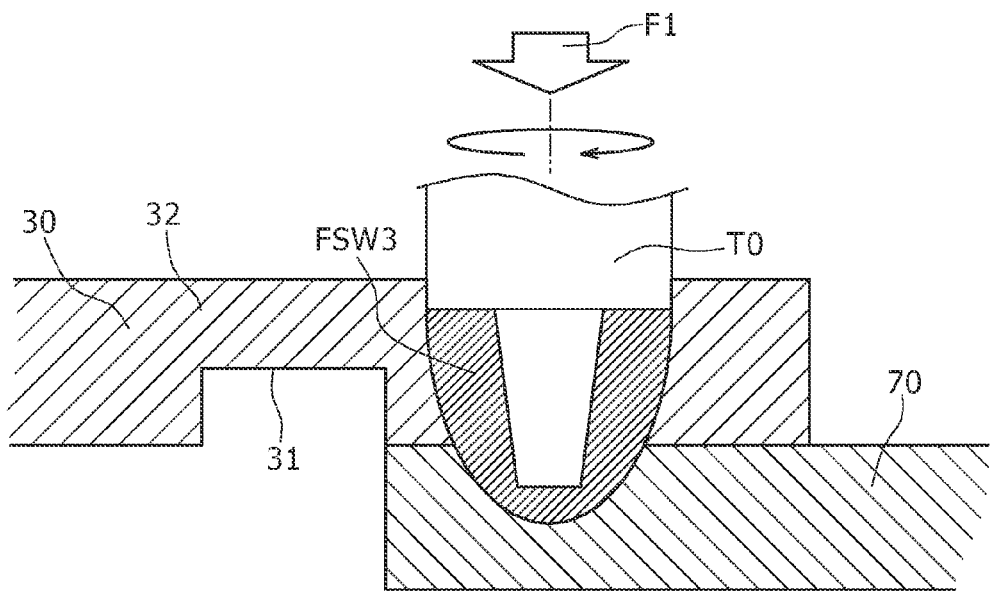
FIG. 3C is an enlarged cross sectional view showing the friction stir weld section of third embodiment.

FIG. 3A through 3C are drawings for describing the friction stir welding structure of the third embodiment.

In the present embodiment, an integrated piece is formed by overlapping the edge of the welding member 30 on the edge of the welding member 70 as shown in FIG. 3A, and friction stir welding the mating surface W3. In other words, the welding member 30 and the welding member 70 are abutted as a lap joint and the abutted surfaces are friction stir welded. FIG. 3B is a drawing showing the friction stir weld section FSW3 formed on the mating surface W3. FIG. 3C is an enlarged cross sectional view showing the friction stir weld section FSW3.

The welding member 30 is a flat plate and a cavity 31 is formed on the rear side. This cavity 31A forms a thin section 32 on the welding member 30. The welding member 70 is a flat plate thicker than the welding member 30.

The edge of the welding member 30 is overlapped on the edge of the welding member 70, and the rotating FSW tool TO is pressed by the load F3 in the P3 direction from the upper side (top side in FIG. 2) of the welding member 30 side towards the mating surface W3 and is inserted in the mating surface F3 as shown in FIG. 3B. The FSW tool TO is inserted in the welding member 30, and after reaching the welding member 70 passing through the mating surface F3, the welding member 30 and the welding member 70 are friction stir welded while moving the FSW tool TO in the direction M3 to obtain the friction stir weld section FSW3 shown in detail in FIG. 3C.

The friction heat generated during this friction stir welding is conveyed to welding members 30 and 70 sides. The heat conducting surface area of the thin section 32 formed on the welding member 30 is formed smaller than the heat conducting surface are of the edge of the welding member 30 serving as the friction stir weld section FSW3, and the heat resistance is large. The conduction of heat to the welding member 30 side from the thin section 32 onward is therefore suppressed. Consequently, the heat deformation of the welding member 30 can be reduced.

The FSW tool TO at the same time applies a load F3 to the welding member 30 during welding. However, the thin section 32 is thinner and weaker in strength than the periphery and so deforms preferentially (earlier) and in this way reduces the deformation of the welding members 30 on other than the thin section 32.

Fourth Embodiment

Figure 4A:
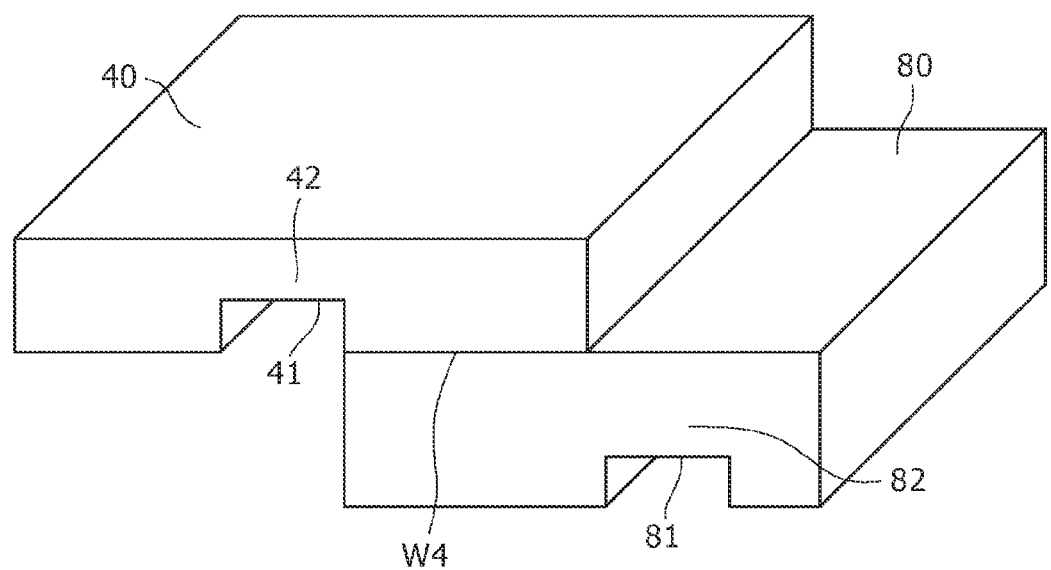
FIG. 4A is an overall perspective view showing the abutted state of a pair of welding members welded in the fourth embodiment.
Figure 5:
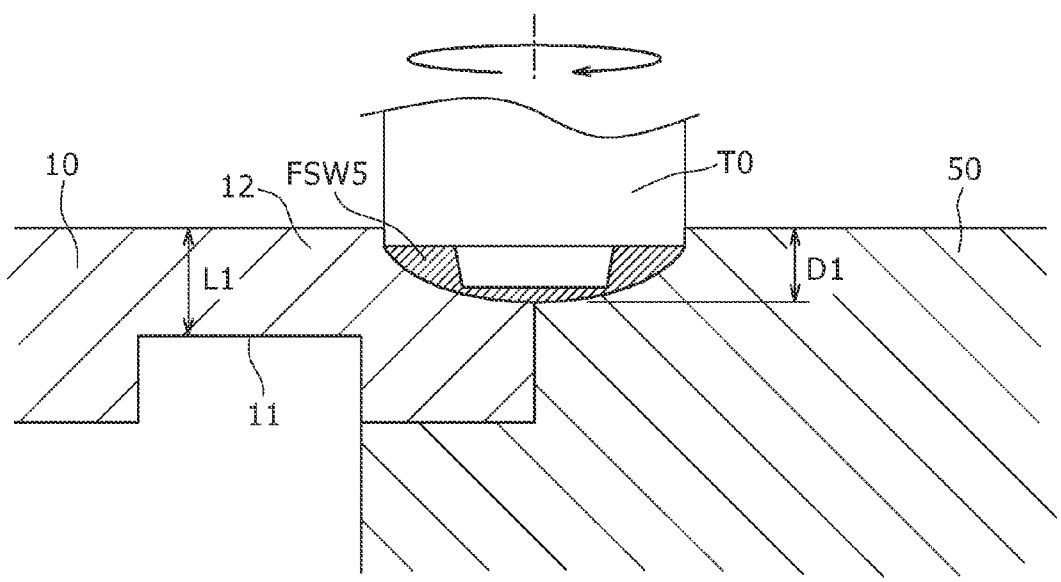
FIG. 5 is an enlarged cross sectional view showing the friction stir weld section of the fifth embodiment.
Figure 6:
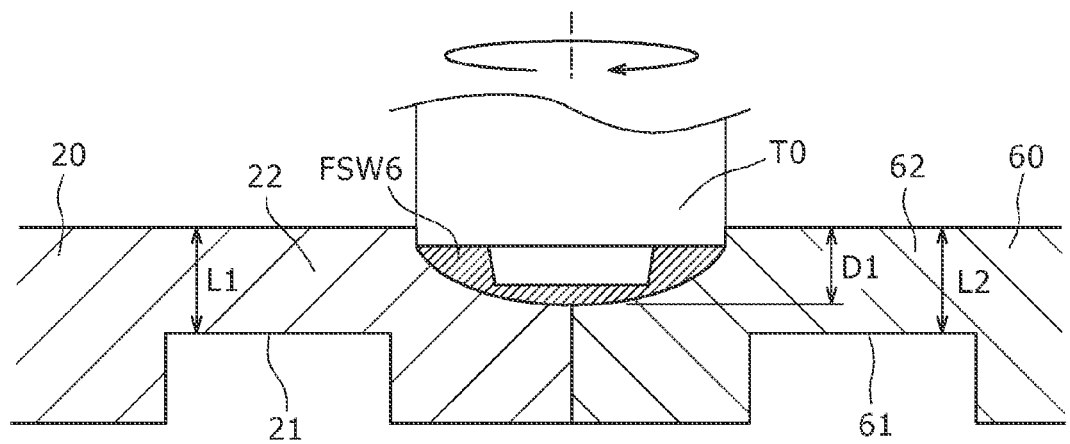
FIG. 6 is an enlarged cross sectional view showing the friction stir weld section of the sixth embodiment.

FIG. 4A through 4C are drawings for describing the friction stir welding structure of the fourth embodiment.

In the present embodiment, the edge of the welding member 40 is overlapped on the edge of the welding member 80 as shown in FIG. 4A and an integrated piece is formed by friction stir welding of the mating surface W4. In other words, the welding member 40 is abutted the welding member 80 as a lap joint and the abutted surface (mating surface W4) is friction stir welded. FIG. 4B is a drawing showing the friction stir weld section FSW4 formed on the mating surface W4. FIG. 4C is an enlarged cross sectional view showing the friction stir weld section FSW4.

The welding member 40 is a flat plate and a cavity 41 is formed on the rear side. This cavity 41A forms a thin section 42 on the welding member 40. The welding member 80 is a flat plate that is thicker than the welding member 40, and a cavity 81 is formed on the rear side. This cavity 81A forms a thin section 82 on the welding member 80.

The edge of the welding member 40 is overlapped on the edge of the welding member 80, and the rotating FSW tool TO is pressed by the load F4 in the P4 direction from the upper side (top side) of the welding member 40 side towards the mating surface W4 as shown in FIG. 4B. The FSW tool TO is inserted in the welding member 40, and after reaching the welding member 80 passing through the mating surface F4, the welding member 40 and the welding member 80 are friction stir welded while moving the FSW tool TO in the direction M4 to obtain the friction stir weld section FSW4 shown in detail in FIG. 4C.

The friction heat generated during this friction stir welding is conveyed to welding members 40 and 80 sides. The heat conduction surface area of the thin section 42 formed on the welding member 40 is smaller than the heat conduction surface area of the edge of the welding member 40 serving as the friction stir weld section FSW4 and the heat resistance is large. The heat conduction to the welding member 40 side can therefore be reduced from the thin section 42 onward. Consequently, the heat deformation of the welding member 40 can be reduced.

The heat conduction surface area of the thin section 82 formed on the welding member 80 is smaller than the heat conduction surface area of the edge of the welding member 80 serving as the friction stir weld section FSW4, and the heat resistance is large. The conduction of heat to the member for forming 80 side is therefore suppressed from the thin section 82 onward. Consequently, heat deformation of the member for forming 80 can be reduced.

The FSW tool TO at the same time applies a load F4 to the welding member 40 during the welding. However, the thin section 42 is thinner and weaker in strength than the periphery and so deforms preferentially (earlier) and can in this way reduce the deformation of the welding members 40 on other than the thin section 42. In the same way for the welding member 80, the low-strength thin section 82 deforms preferentially (earlier) and so can reduce deformation on the welding member 80 on other than the thin section 82.

Fifth Embodiment

In the friction stir welding structure of the present embodiment, the material for the welding members 10 and 50, the thickness of the thin section 12, and the depth of the friction stir weld section FSW5 are each defined for the friction stir welding structure of the first embodiment; in a structure in which the welding member 10 having a tensile strength S1 is welded to the welding member 50 having a tensile strength S2.

The conditions for the fifth embodiment are the following (I) and (II).

(I) Condition 1
The tensile strength S1 and S2 are set to satisfy the condition:

$$S1<S2 \tag{1}$$

(II) Condition 2
The weld depth D1 of the friction stir weld section FSW5, and the plate thickness L1 of the thin section 12 of the welding member 10 are set to satisfy:

$$\{(2\times S1)/(S1+S2)\}\times L1<D1 \tag{2}$$

A friction stir welding structure can in this way be provided in which the strength of the friction stir weld section FSW5 has larger strength than the thin section 12. Also, if the weld depth D1 is minimized to satisfy the relations in formula (1) and formula (2), the load and the friction heat occurring during the friction stir welding can be lowered, and the deformation can be reduced even further.

Sixth Embodiment

In the friction stir welding structure of the present embodiment, the material for the welding members 20 and 60, the thickness of the thin sections 22, 62, and the depth of the friction stir weld section FSW6 are each defined for the friction stir welding structure of the second embodiment; in a structure in which the welding member 20 having a tensile strength S1 is welded to the welding member 50 having a tensile strength S2.

The conditions for the sixth embodiment are the following (I), (II), and (III).

(I) Condition 1
The tensile strength S1 and S2 are set to satisfy the condition:

$$S1<S2 \tag{1}$$

(II) Condition 2
The weld depth D1 of the friction stir weld section FSW6, and the plate thickness L1 of the thin section 22 of the welding member 20 are set to satisfy:

$$\{(2\times S1)/(S1+S2)\}\times L1<D1 \tag{2}$$

(III) Condition 3
The plate thickness L1 of the thin section 22 of the welding member 20, and the plate thickness L2 of the thin section 62 of the welding member are set to satisfy:

$$(S1/S2)\times L1<L2 \tag{3}$$

A friction stir welding structure can in this way be provided in which the strength of the friction stir weld section FSW6 is larger than the strength of the thin section 22 and the thin section 62. Also, if the weld depth D1 is minimized to satisfy the relations in formula (1) through formula (3), the load and the friction heat occurring during the friction stir welding can be lowered, and the deformation can be reduced even further.

Seventh Embodiment

Figure 7:
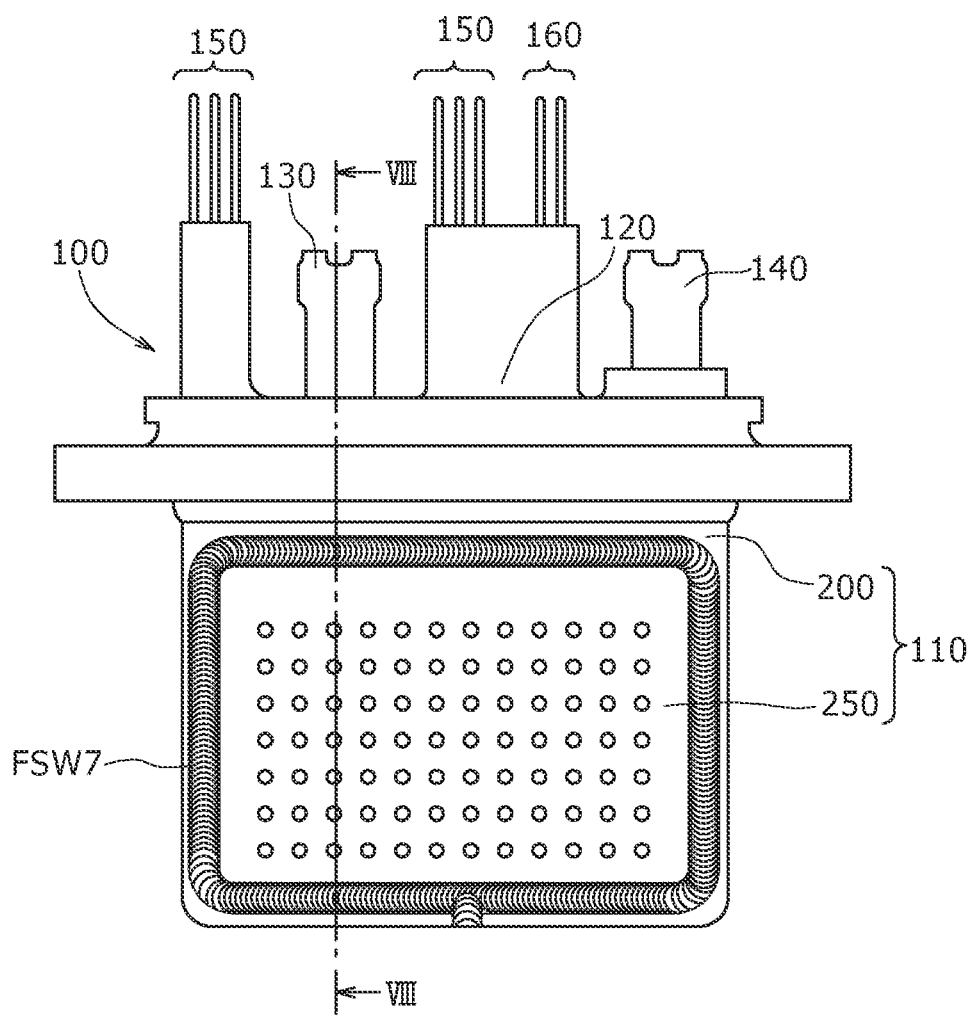
FIG. 7 is a structural view of the power semiconductor device of the seventh embodiment.
Figure 8:
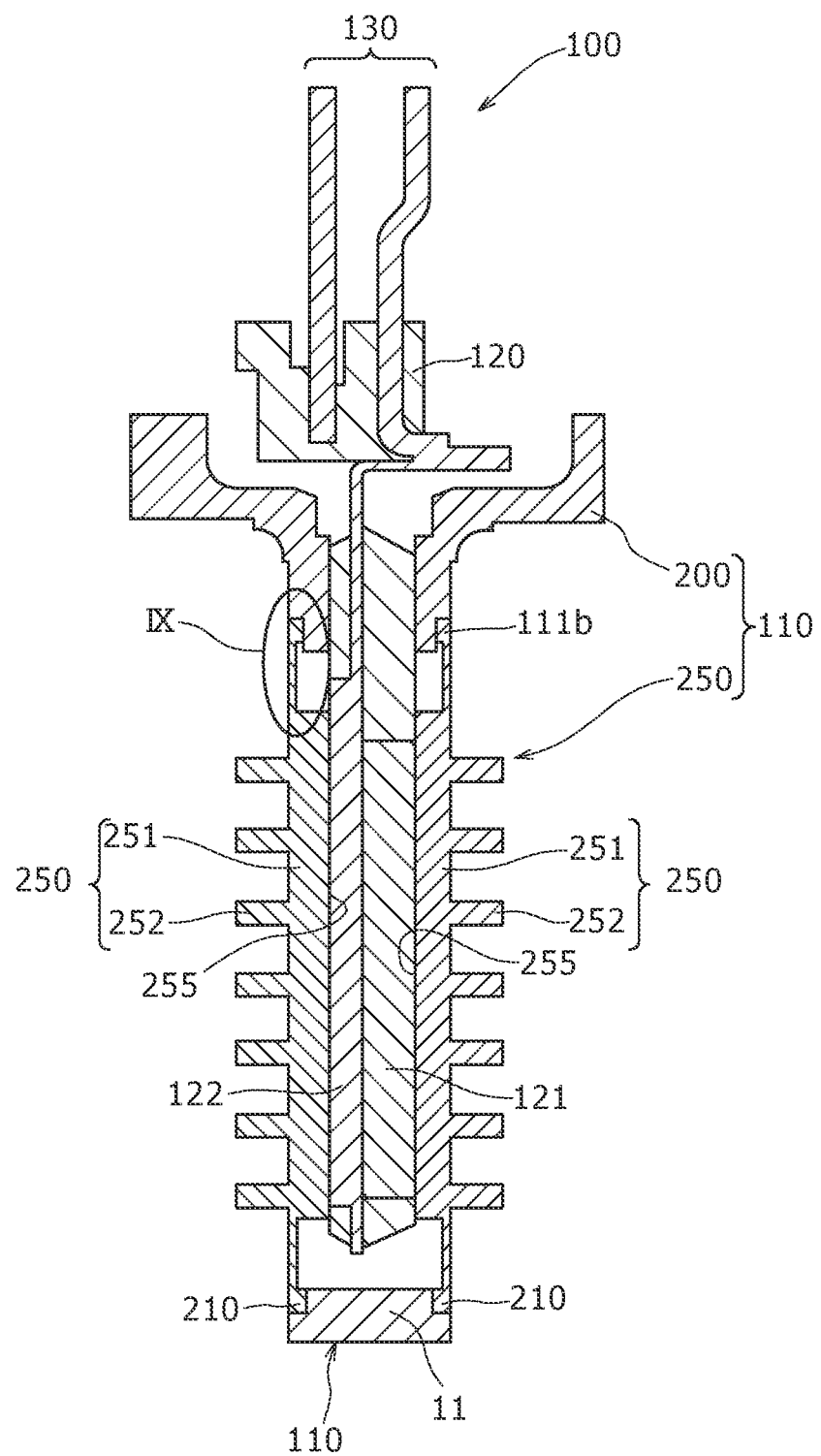
FIG. 8 is a cross sectional view taken along lines VIII-VIII of FIG. 7.
Figure 9:
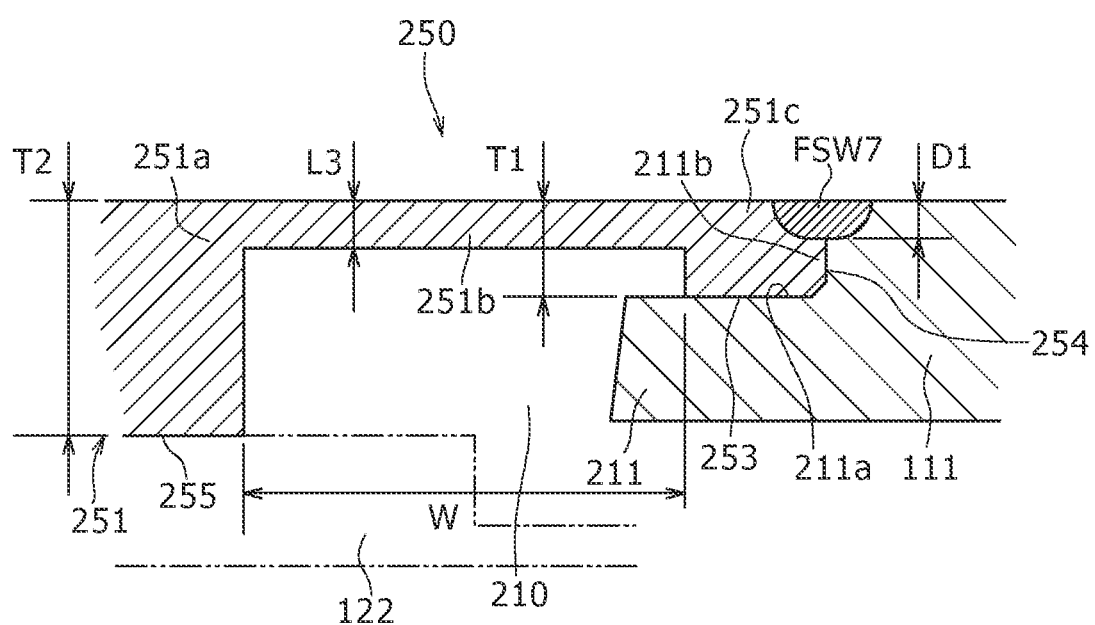
FIG. 9 is an enlarged view of the IX section of FIG. 8.

The seventh embodiment is a friction stir welding structure of the present invention that is applicable to a power module semiconductor device with heat sink fins. A description is rendered while referring to FIG. 7 through FIG. 9. FIG. 7 is a frontal view of a power semiconductor device 100. FIG. 8 is a line cross sectional view taken along lines VIII through VIII in FIG. 7. FIG. 9 is an enlarged view of section IX in FIG. 8.

The power semiconductor device 100 with heat sink fins as shown in FIG. 7 includes a case 110, a power semiconductor module 120 housed within the case 110, an external direct current positive and negative terminal 130 each coupled to a positive and negative direct current terminal on the power semiconductor module 120, an alternating current external terminal 140 to supply alternating-current power to the electric motor, the respective gate signal external terminals 150 from the power semiconductor module 120, and an emitter voltage detector external terminal 160.

The power semiconductor device 100 with heat sink fins includes a three-phase bridge circuit having a U phase, V phase, and W phase for drive control of a three-phase alternating current electric motor. The power semiconductor module 120 of the power semiconductor device 100 for each phase contains an upper arm IGBT 121 (See FIG. 8) and a lower arm IGBT 121. The power semiconductor device 100 is cooled by immersion in the fluid circuit path of a cooling jacket not shown in the drawing.

Referring to FIG. 8, the case 110 contains a case body 200 internally housing the power semiconductor module 120, and the heat sink with fins 250. The openings 210 are formed respectively on both sides of the case body 200, and the heat sink with fins 250 are respectively friction stir welded on the periphery of each of the openings 210, and the interior of the case body 200 is sealed. The reference numeral FSW7 in FIG. 7 and FIG. 9 denotes the friction stir weld section. The IGBT 121 in the power semiconductor module 120 is attached to the sealing surface 255 serving as the case inner surface of the heat sink with fins 250 within the case 110.

The heat generated by the IGBT 121 contained within the power semiconductor module 120, is conveyed by way of the lead frame 122 and the sealing surface 255 to the respectively attached heat sink with fins 250, and is radiated away by conveying the heat in fluid through the cooling jacket.

The case body 200 is manufactured by aluminum die casting and along with strength also has a low manufacturing cost. The heat sink with fins 250 is also made from aluminum material having high heat conductance and heat dissipating properties. The case 110 is in this way made from the case body 200 and the heat sink (with fins) 250 so that a case 110 is achieved that provides strength, (low) manufacturing cost, and heat dissipating properties.

The pair of heat sink with fins 250 are identical members. The heat sink with fins 250 includes a heat sink body 251, and a plurality of pin fins 252 protruding from the surface of the heat sink body 251. The heat sink body 251 is described while referring to FIG. 9 and contains a rectangular thick plate 251a in the center section, a thin section 251b formed in a square annular shape on the periphery of the rectangular thick plate 251a, and a friction stir weld section 251c formed in a square annular shape farther on the outer side periphery of the thin section 251b, and thicker than the thin section 251b.

A heat sink mounting section 211 is formed protruding into the center side of the opening 210 and recessed from the case surface to at just a depth T1 on the inner periphery of the opening 210 in the case body 200 as shown in FIG. 9. The mounting section 211 includes a mounting surface 211a, and a side wall 211b rising toward the outer side of the case from the mounting surface 211a. The case inner side surface 253 of the weld section 251c of heat sink 250 is mounted in the mounting surface 211a, and directly abuts the side wall 211b of the case outer circumferential surface 254 of the friction stir weld section 251c.

The friction stir weld section FSW7 is formed by mounting the weld section 251c of the heat sink with fins 250 on the mounting surface 211a formed on the case body 200, and forming a friction stir welding section from the case outer circumferential surface 254 of the heat sink with fins 250, and the abutting surface of the side wall 211b rising from the mounting surface 211a on the case body 200 with FWS tool. The friction stir welded section FSW7 as shown in FIG. 7, is formed in a square annular shape along the entire periphery of the heat sink 250.

In FIG. 9, the plate thickness T1 of the friction stir weld section 251c of the heat sink with fins 250 is set to 1 mm; the plate thickness T2 of the heat sink body 251 including a sealing surface 255 is set to 2.5 mm; the plate thickness L3 of the thin section 251b is set to 0.5 mm, and the weld depth D1 of the friction stir welded section FSW7 is set to 0.7 mm.

In FIG. 9, the length of the thin section 251b is expressed as W. The length of this thin section 251b is defined as the length of the thin section 251b between the friction stir weld section 251c of heat sink with fins 250 and the heat sink body 251 of the power semiconductor module 120.

FIG. 10 shows the flatness of the sealing surface 255 relative to the length W of the thin section in the friction stir welding structure of FIG. 9 satisfying the above described conditions (1) through (3).

As clearly shown in FIG. 10, forming a thin section 251b in the vicinity of the friction stir weld section 251c can reduce deterioration of the flatness in the heat sink with fins 250 by approximately half. In this way, the sealing between the power semiconductor module 120 and the heat sink 250 can be improved, and the heat dissipation properties of the power semiconductor device 100 can be enhanced.

In other words, in the friction stir welding structure of FIG. 9, deterioration in flatness of the sealing surface 255 occurring due to the conveyance of the press load from the FSW tool and the friction heat occurring during friction stir welding can be suppressed by forming the thin section 251b in a plate thickness L3.

The above described embodiments are only examples and the present invention is not limited to these embodiments. Accordingly, the components applicable to the friction stir welding structure of the present invention are not limited to power semiconductor devices.

A variety of embodiments and adaptations were described above, however the present invention is not limited to the described content of the embodiments and adaptations. Other forms and structures considered as falling within the scope of the technical concept of the present invention may be included within the range of the present invention.

The contents disclosed in the following priority basic application are included by reference.

Japanese Patent Application No. 2011-179706 (filed on Aug. 19, 2011)

The invention claimed is:

1. A friction stir welding structure comprising:
 first and second members formed into one piece by friction stir welding, wherein
  a given section is formed along the friction stir weld section on at least one of the first and second members,
  the first member and the second member are abutted together as a lap joint, and the abutted surface is friction stir welded,
  the tensile strength S1 of the first member is set smaller than the tensile strength S2 of the second member, and
  the relation between the thickness L1 of the given section of the first member and the weld depth D1 of the friction stir weld section is defined as: $(2 \times S1)/(S1+S2) \times L1 < D1$.

2. The friction stir welding structure according to claim 1, wherein
 the first member is a rectangular plate, and the second member includes an opening sealed by the rectangular plate, and
 a step is formed in the opening of the second member,
 a weld section mounted on the step is formed on the outer peripheral edge of the first member,
 the section where the outer peripheral edge of the first member abuts the step inner surface of the opening of the second member is welded across the entire circumference by friction stir welding, and
 the given section is formed along the friction stir weld section of the first member.

3. The power semiconductor device including the friction stir welding structure according to claim 2, comprising:
 a power semiconductor module;
 a case that stores the power semiconductor module; and
 a heat sink that cools the power semiconductor module,
 wherein the second member is the case, and the first member is the heat sink that seals the opening of the second member.

4. A friction stir welding structure comprising:
 first and second members formed into one piece by friction stir welding, wherein
  a given section is formed along the friction stir weld section on at least one of the first and second members,
  both the first and the second members contain given sections,
  the first member and the second member are abutted and friction stir welded together as a butt joint,
  the tensile strength S1 of the first member is set smaller than the tensile strength S2 of the second member, and
  when the thickness of the given section of the first member is L1, and the thickness of the given section of the second member is L2, and the weld depth of the friction stir welding section is D1, the friction stir welding structure satisfies the relation: $(2 \times S1)/(S1+S2) \times L1 < D1$ and $(S1/S2) \times L1 < L2$.

* * * * *